(12) United States Patent
Chinone et al.

(10) Patent No.: US 8,236,672 B2
(45) Date of Patent: Aug. 7, 2012

(54) SEMICONDUCTOR DEVICE AND METHOD FOR MANUFACTURING SEMICONDUCTOR DEVICE

(75) Inventors: Takako Chinone, Tokyo (JP); Ji-Hao Liang, Tokyo (JP); Yasuyuki Shibata, Tokyo (JP); Jiro Higashino, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 305 days.

(21) Appl. No.: 12/636,961

(22) Filed: Dec. 14, 2009

(65) Prior Publication Data
US 2010/0155740 A1    Jun. 24, 2010

(30) Foreign Application Priority Data
Dec. 24, 2008   (JP) .................... 2008-327478

(51) Int. Cl.
| H01L 21/36 | (2006.01) |
| H01L 21/20 | (2006.01) |
| H01L 21/00 | (2006.01) |
| H01L 29/24 | (2006.01) |
| H01L 21/18 | (2006.01) |
| H01L 27/108 | (2006.01) |

(52) U.S. Cl. ............ 438/481; 438/478; 438/46; 438/44; 257/103; 257/E21.087; 257/E21.09; 257/E29.089

(58) Field of Classification Search .............. 438/44, 438/46, 478, 481; 257/103, E21.087, E21.09, 257/E29.089
See application file for complete search history.

(56) References Cited

U.S. PATENT DOCUMENTS
6,620,238 B2 *   9/2003   Tsuda et al. ................ 117/90

FOREIGN PATENT DOCUMENTS
JP         2000-228539 A        8/2000
* cited by examiner Primary Examiner — Luan C Thai
(74) Attorney, Agent, or Firm — Holtz, Holtz, Goodman & Chick, PC

(57) ABSTRACT

A cavity-containing layer having a plurality of cavities is formed on a growth substrate by carrying out in alternating fashion a plurality of cycles of a first and second growth steps of growing a group III nitride at growth rates different from each other. The semiconductor epitaxial layer is subsequently formed on the cavity-containing layer, after which a support substrate is bonded to the semiconductor epitaxial layer. The growth substrate is separated from the cavity-containing layer.

26 Claims, 8 Drawing Sheets

METAL Ga

SEMICONDUCTOR EPITAXIAL
LAYER SEPARATION SURFACE

VESTIGES OF COLUMNAR STRUCTURES
(CONNECTION PORTION)

SEPARATION SURFACE OF
SAPPHIRE SUBSTRATE

SEPARATION SURFACE OF
SEMICONDUCTOR EPITAXIAL LAYER

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing a semiconductor device.

2. Description of the Related Art

Light-emitting diodes and other semiconductor light-emitting devices are manufactured by forming semiconductor layers or layered structure including an n-layer, an active layer, a p-layer on a growth substrate such as a sapphire substrate, and forming electrodes on the growth substrate and the surface of the semiconductor layer. Part of the semiconductor layer is etched away using reactive ion etching or another technique to expose the n-layer and form electrodes on the n-layer and p-layer, respectively.

Semiconductor light-emitting devices are increasingly efficient and have higher output through recent technological advances. However, the amount of heat produced in the semiconductor light-emitting devices has also increased together with the higher output, which causes problems such as decreased light-emission efficiency and decreased reliability of the semiconductor light-emitting device through, for example, degradation of the semiconductor layer. In order to solve the problems, a configuration is used in which the growth substrate having relatively low thermal conductivity is removed, and the semiconductor film or layered structure is supported by a metal having relatively high thermal conductivity instead. Heat dissipation of the semiconductor light-emitting device is improved by adopting such a structure, and improvement in light-emission efficiency, more particularly, light extraction efficiency can be expected by removing the growth substrate. In other words, it is possible to reduce light absorption that occurs when light passes through the growth substrate, and to reduce total reflection light occurring at the interface between the semiconductor film and the growth substrate due to the refractive index difference. It is a general practice to remove the growth substrate using a laser lift off (LLO) method.

Japanese Laid-open Patent Application No. 2000-228539 (hereinafter referred to as Patent Reference 1) discloses a manufacturing process of a light-emitting device wherein a semiconductor epitaxial layer is formed on a growth substrate via an amorphous nitrogen compound semiconductor layer. Patent Reference 1 discloses a process in which the growth temperature is set to 600° C. or less and the supply ratio of a group III element with respect to a V group element is set to 1000 or less when an amorphous nitrogen compound semiconductor layer is grown by vapor phase deposition to thereby form voids within the amorphous nitrogen compound semiconductor layer, and that the growth substrate, in some cases, is naturally separated from the semiconductor epitaxial layer.

SUMMARY OF THE INVENTION

When separating or removing the growth substrate using the LLO method, the nitride semiconductor decomposes and produces $N_2$ gas by absorbing laser light, and there are cases in which the gas pressure produces cracks in the semiconductor epitaxial layer. The implementation of the LLO method leads to higher costs because expensive special equipment therefore must be used. It is furthermore difficult to process a plurality of wafers in a single process using the LLO method, and the process entails scanning a laser light across the entire wafer surface. Therefore, a relatively long processing time is required. The processing time is further extended as the diameter of wafers is increased. Therefore, it is thought that there are many advantages in terms of quality, cost, and productivity improvement when the growth substrate can be separated using a simpler method rather than the LLO method.

The required issues related to the separation or removal of the growth substrate are noted below. First, the film of the semiconductor epitaxial layers must be of good quality after the growth substrate has been separated. In other words, cracks or other defects in the semiconductor epitaxial layer must not be generated when the growth substrate is separated, and there must be few threading dislocations or other crystal defects in the semiconductor epitaxial layer. Second, the growth substrate must not be naturally separated. Specifically, post-processing becomes difficult when the growth substrate is naturally separated during handling of the wafer or in an intermediate process step because the thickness of the semiconductor epitaxial layer is small. For example, electrode formation and bonding with the support substrate becomes very difficult when the growth substrate is separated due to thermal shock or the like in the epitaxial growth step of the semiconductor layer. Therefore, bonding strength sufficient to prevent separation of the growth substrate from the semiconductor epitaxial layer must be ensured, and separation must be facilitated in the growth substrate separation or removal step; i.e., the ability to control the separated of the growth substrate must be ensured.

The present invention was contrived in view of the foregoing, it being an object thereof to provide method for manufacturing a semiconductor device in which the growth substrate can be separated using a simpler method and without reliance on the LLO method.

According to the present invention, there is provided a method for manufacturing a semiconductor device, which comprises the step of: forming on a growth substrate a cavity-containing layer composed of a group III nitride compound semiconductor, and including cavities and columnar structures interspersed therein; forming a group III nitride compound semiconductor epitaxial layer on said cavity-containing layer; bonding a support substrate on said group III nitride compound semiconductor epitaxial layer; and separating the growth substrate from said group III nitride compound semiconductor epitaxial layer from said cavity-containing layer, the interface therebetween serving as a separation boundary.

The step of forming the cavity-containing layer comprises a step of forming on the growth substrate a base layer or underlying layer comprising a group III nitride and whose surface has columnar structures; and a step of repeating in alternating fashion a plurality of cycles of a first growth step and a second growth step of growing a group III nitride at growth rates different from each other on the base layer.

The first growth step includes a process for supplying a group V material and a group III material at their respective predetermined flow rates at a higher growth temperature than the growth temperature of the base layer to grow the group III nitride mainly in the longitudinal direction; and the second growth step includes a process for supplying a group V material and a group III material at flow rates that are greater than the flow rates in the first step at a higher growth temperature than the growth temperature of the base layer to growing the group III nitride mainly in the lateral direction.

The value of S1/S2 is preferably 0.5 or higher, where S1 is the supply ratio of a group V material and a group III material (V/III ratio) in the step of forming the base layer, and S2 is the supply ratio of a group V material and a group III material (V/III ratio) in the step of forming the group III nitride compound semiconductor epitaxial layer. The step of forming the base layer is preferably carried out under conditions in which the group V material and the group III material are supplied so that the V/III ratio is 3,000 or higher at a lower temperature than the growth temperature of the group III nitride compound semiconductor epitaxial layer.

The method for manufacturing a layered structure of the present invention comprises a step of forming on a growth substrate a cavity-containing layer composed of a group III nitride compound semiconductor layer and including cavities and columnar structures interspersed in the cavity-containing layer.

The step of forming the cavity-containing layer comprises the steps of: supplying a group V material and a group III material so that the V/III ratio is 3,000 or higher, and forming on the growth substrate a base layer composed of a group III nitride; and repeating in alternating fashion a plurality of cycles of a first growth step and a second growth step of growing a group III nitride at growth rates different from each other on the base layer.

The first growth step includes a process for supplying a group V material and a group III material at their respective predetermined flow rates at a higher growth temperature than the growth temperature of the base layer, and growing the group III nitride mainly in the longitudinal direction; and the second growth step includes a process for supplying a group V material and a group III material at a flow rate that is greater than the flow rate in the first growth step at a higher growth temperature than the growth temperature of the base layer, and growing the group III nitride mainly in the lateral direction.

The semiconductor wafer of the present invention comprises a growth substrate; a cavity-containing layer composed of a group III nitride compound semiconductor formed on the growth substrate, and including cavities and columnar structures interspersed in the cavity-containing layer; and a group III nitride compound semiconductor epitaxial layer formed on the cavity-containing layer.

The width of the columnar structures is preferably 1 μm or more and 18 μm or less. Also, the value of $T_1 \times T_2$ is preferably 0.6 to 2.5, where $T_1$ is the thickness in microns of the cavity-containing layer, and $T_2$ is the thickness in microns of the group III nitride compound semiconductor epitaxial layer.

The layered structure of the present invention has a growth substrate; and a cavity-containing layer composed of a group III nitride compound semiconductor and including cavities and columnar structures interspersed in the layer, the cavity-containing layer being disposed on the growth substrate. The width of the columnar structures is preferably 1 μm or more and 18 μm or less.

Also, the layered structure of the present invention comprises a growth substrate and a group III nitride layer that is layered on the growth substrate, wherein the group III nitride layer comprises a layer having a plurality of internal cavities formed by supplying a group V material and a group III material so that the V/III ratio is 3,000 or higher, forming on the growth substrate a base layer having a group III nitride, and subsequently carrying out in alternating fashion a plurality of cycles of a first step and a second step of growing a group III nitride at growth rates different from each other on the base layer.

In accordance with the method for manufacturing a semiconductor device of the present invention, it is possible to obtain a bonding strength that is high enough for natural removal or separation of the growth substrate not to occur between the growth substrate and the semiconductor epitaxial layer. On the other hand, a growth substrate can be removed without using LLO in the growth substrate removal step.

DESCRIPTION OF THE PREFERRED EMBODIMENTS

Figure 1:
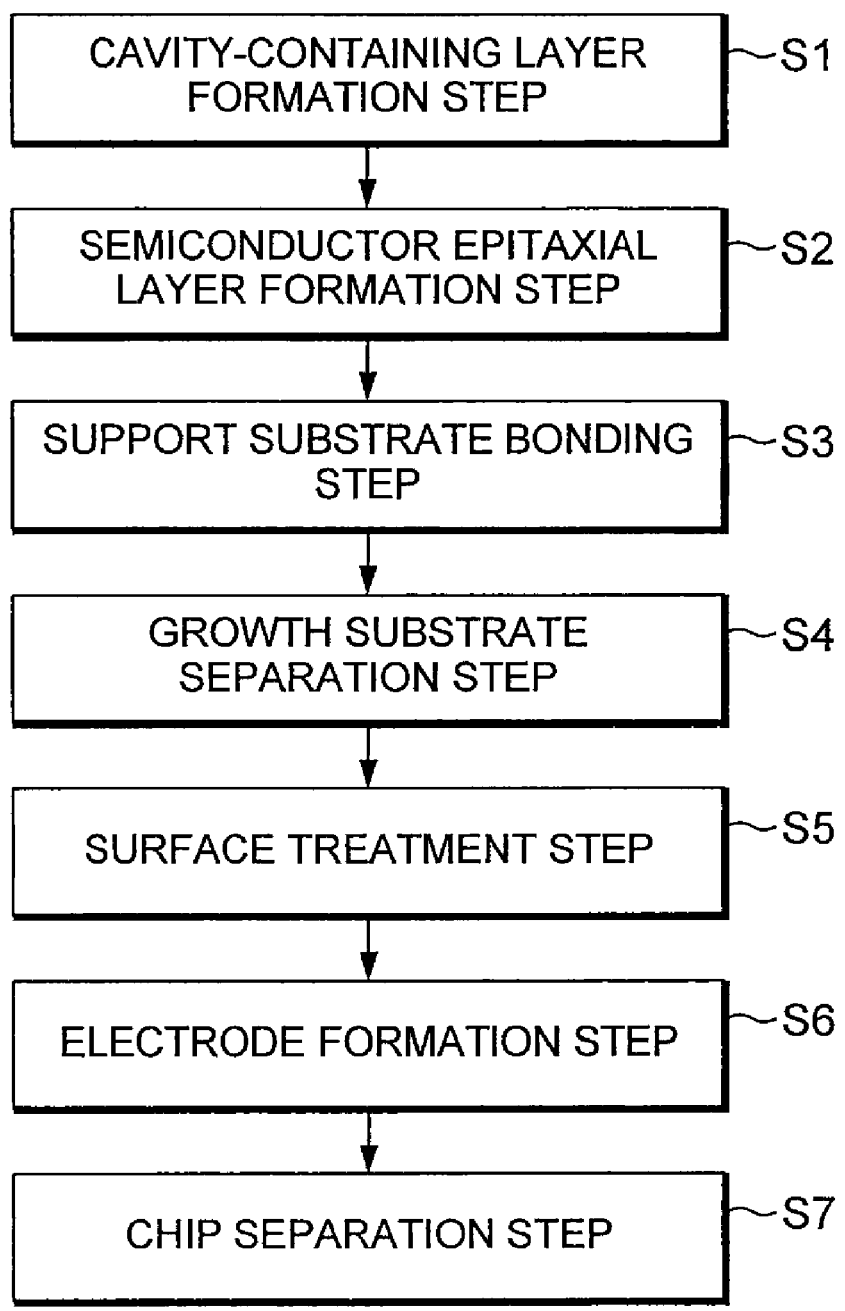
FIG. 1 is a flowchart of the steps for manufacturing a semiconductor light-emitting device according to an embodiment of the present invention.
Figure 2:
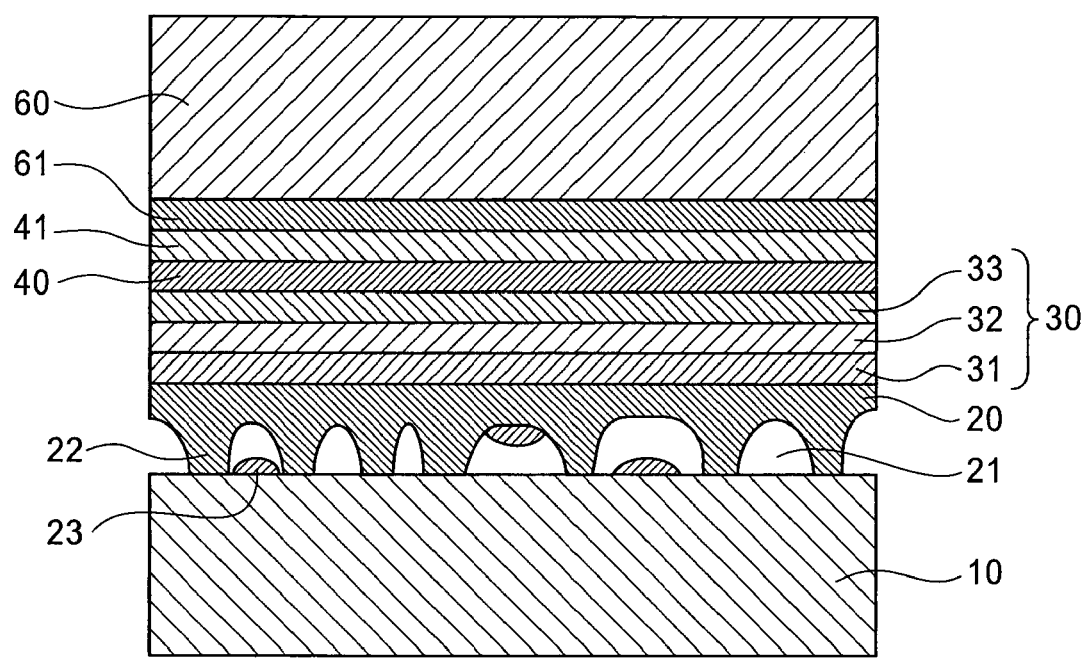
FIG. 2 is a cross-sectional view showing the structure of the semiconductor light-emitting diode in the stage prior to separation of the growth substrate according to the embodiment of the present invention.

Embodiments of the present invention are described below with reference to the drawings. In the drawings shown below, the same reference numerals are used for the essentially the same or equivalent constituent elements and portions. The present invention relates to a semiconductor device, and a semiconductor light-emitting device is described as an example below. FIG. 1 is a flowchart of the steps of manufacturing a semiconductor light-emitting device according to an embodiment of the present invention. FIG. 2 is a cross-sectional view showing the structure of the semiconductor light-emitting diode in the step prior to removal of the growth substrate.

The method for manufacturing a semiconductor light-emitting device of the present embodiment includes a cavity-containing layer formation step (step S1) of forming a cavity-containing layer 20 composed of a group III nitride having numerous internal cavities on the growth substrate 10; a semiconductor epitaxial layer formation step (step S2) of forming a semiconductor epitaxial layer (i.e., device function layer or layered structure) 30 including a light-emitting layer or the like composed of a group III nitride on the cavity-containing layer; a support substrate bonding step (step S3) of bonding a support substrate 60 on the semiconductor epitaxial layer 30; a growth substrate separation step or removal step (step S4) of separating the growth substrate 10 from the semiconductor epitaxial layer 30 in which the interface between the cavity-containing layer 20 and the growth substrate 10 serves as a separation boundary; a surface treatment step (step S5) of flattening the surface of the semiconductor epitaxial layer 30 exposed by separating the growth substrate 10; an electrode formation step (step S6) of forming an electrode 50 on the surface-treated semiconductor epitaxial layer 30; and a chip separation step (step S7) of separating the semiconductor epitaxial layer 30 with the support substrate into individual semiconductor chips or dies.

The cavity-containing layer 20 is composed of a group III nitride which is of the same crystalline system as the semiconductor epitaxial layer 30, and is disposed between the growth substrate 10 and the semiconductor epitaxial layer 30. The cavity-containing layer 20 has a porous structure in which numerous cavities (or voids) 21 are mostly uniformly distributed in a plane extending in the cavity-containing layer. Numerous cavities 21 are formed in the cavity-containing layer 20, whereby a plurality of columnar structures 22 are formed between adjacent cavities. The columnar structures 22 constitute connection portions between the growth substrate 10 and the semiconductor epitaxial layer 30. The size (width) of individual columnar structures 22 is about several microns and the columnar structures are mostly uniformly distributed in a plane the cavity-containing layer 20 is extending. A bonding strength sufficient to prevent the growth substrate 10 from being naturally separated or removed is ensured by disposing the cavity-containing layer 20 having such a structure between the growth substrate 10 and the semiconductor epitaxial layer 30, and the growth substrate 10 can be separated from the cavity-containing layer 20 in which the interface between the cavity-containing layer 20 and the growth substrate 10 serves as a separation boundary surface, by merely applying a small external force without using the LLO technique in the growth substrate removal step (step S4).

When the cavities 21 formed within the cavity-containing layer 20 and the accompanying columnar structures 22 are unevenly distributed, or when the sizes of the cavities 21 and the columnar structures 22 are unsuitable, the growth substrate 10 is naturally separated at an unexpected time, or separation between the growth substrate 10 and the cavity-containing layer 20 cannot be achieved, and processing yield is liable to be dramatically reduced. Therefore, the cavities 21 and the columnar structures 22 are substantially uniformly distributed in the plane in the cavity-containing layer formation step (step S1), and it is important to ensure that the size of each of the columnar structures 22 and the cavities 21 is suitable for separating the growth substrate.

Figure 3:
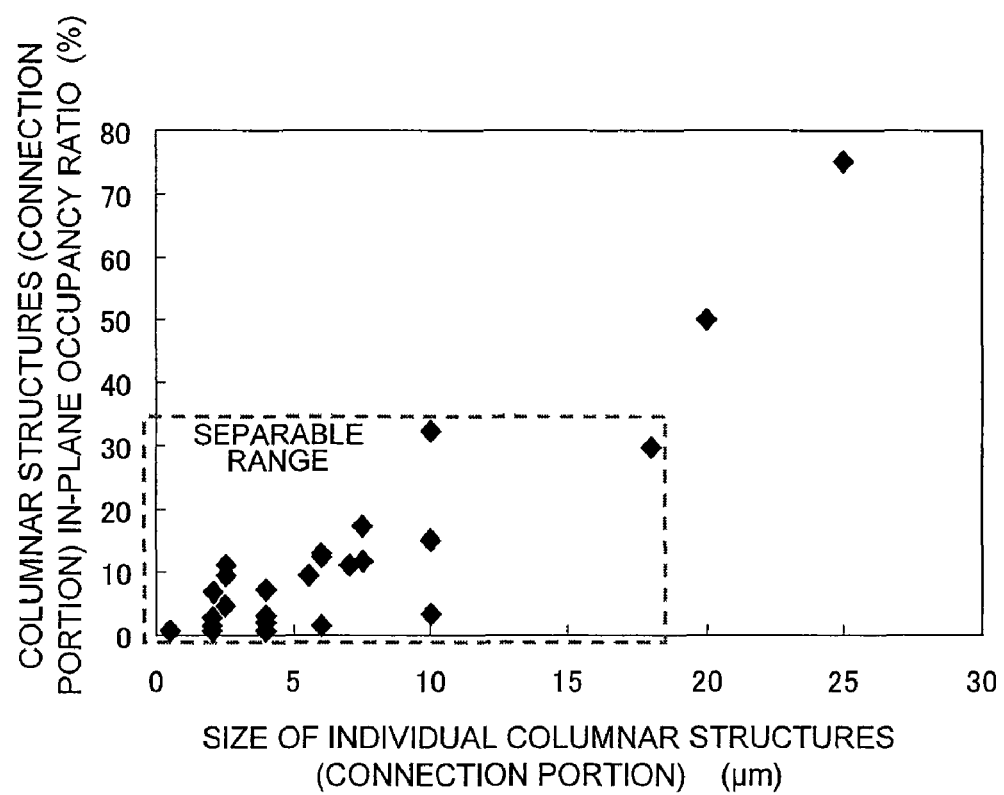
FIG. 3 is a graph showing the relationship between the size (width) of a single columnar structure and the in-plane occupancy ratio of the columnar structures according to the embodiment of the present invention.

FIG. 3 is a graph showing the size (width) of individual columnar structures 22 formed in the cavity-containing layer 20, and the in-plane occupancy ratio of all columnar structures 22. The broken line in FIG. 3 shows the range in which the growth substrate 10 can be adequately separated or removed from the cavity-containing layer 20, in which the interface between the cavity-containing layer 20 and the growth substrate 10 serves as a separation or removal boundary. The columnar structures 22 are substantially uniformly distributed in the plane in which the cavity-containing layer 20 extends, and the occupancy ratio in the plane increases as the size (width) of the columnar structures increases. In other words, the surface area of the connection portions between the growth substrate 10 and the cavity-containing layer 20 is increased when the size of the columnar structures 22 is increased, and the bonding strength is therefore increased. Accordingly, it is difficult to separate the growth substrate 10 from the cavity-containing layer 20 when the sizes of the columnar structures 22 are too large.

The thickness of the cavity-containing layer 20 must be determined in accordance with the thickness of the semiconductor epitaxial layer 30 in order to achieve favorable separation between the growth substrate 10 and the cavity-containing layer 20. Specifically, when the thickness of the semiconductor epitaxial layer 30 is large, the stress produced in the film is increased and the growth substrate 10 is naturally separated when the cavity-containing layer 20 does not possess sufficient mechanical strength to withstand the stress. On the other hand, the growth substrate 10 cannot be separated when the mechanical strength of the cavity-containing layer 20 is excessively large in relation to the stress. The mechanical strength of the cavity-containing layer 20 is reduced as the thickness of the cavity-containing layer 20 is increased and the growth substrate 10 is readily separated or removed. Therefore, the thickness of the cavity-containing layer 20 must be set in accordance with the thickness of the semiconductor epitaxial layer 30 to be layered.

Figure 4:
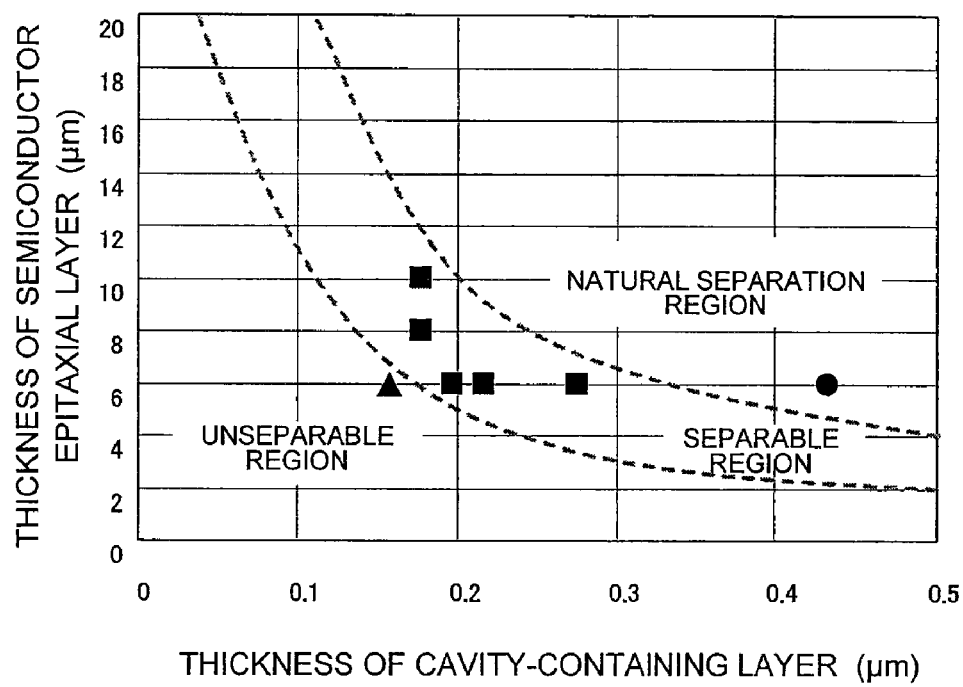
FIG. 4 is a graph showing the range in which adequate separation of the growth substrate can be carried out in relation to the thickness of the cavity-containing layer and the thickness of the semiconductor epitaxial layer.

FIG. 4 is a plot of the measured values of fabricated samples, wherein the horizontal axis represents the thickness of the cavity-containing layer 20 and the vertical axis represents the thickness of the semiconductor epitaxial layer 30. The triangular plots in the graph show the case in which the growth substrate 10 could not be separated. The square plots in the graph show the case in which the growth substrate 10 could be adequately separated or removed from the cavity-containing layer 20, in which the interface therebetween serves as a separation or removal boundary surface. Circular plots in the graph show the case in which natural or unintentional separation occurs prior to the growth substrate separation step. The region between the two broken lines in the graph is set by the data and is a region in which the growth substrate 10 can be adequately separated from the cavity-containing layer 20. In other words, the portion to the right of this region is a region in which the growth substrate 10 is naturally separated, and the portion to the left of this region is a region in which separation or removal is impossible.

Specifically, the region in which the growth substrate can be adequately separated from the cavity-containing layer is the range enclosed by the broken lines in FIG. 3. In this range, the size (width) of a single columnar structure is in the range of 1 μm to 18 μm, and the value of $T_1 \times T_2$ is about in the range of 0.6 to 2.5 where $T_1$ μm is the thickness of the cavity-containing layer 20, and $T_2$ μm is the thickness of the semiconductor epitaxial layer 30. By satisfying the conditions, the growth substrate 10 can be adequately separated from the cavity-containing layer 20 without the occurrence of natural separation.

Next, the method for manufacturing a semiconductor light-emitting device of the present invention will be described with reference to FIGS. 5A to 5I. FIGS. 5A to 5I are cross-sectional views of each process step in the steps of manufacturing the semiconductor light-emitting device of the present invention.

[Step 1: Cavity-Containing Layer Formation Step]

The cavity-containing layer formation step includes a step of forming a GaN base layer $20_a$ on the growth substrate 10 by growing a low-temperature buffer layer having a high V/III by vapor phase growth, and a step of completing the cavity-containing layer 20 by repeating in alternating fashion a plurality of cycles of a process (i.e., first step) of growing GaN in longitudinal-growth promoting conditions or modes, and a process (i.e., second step) of growing GaN in lateral-growth promoting conditions or modes. The V/III ratio is a value obtained by dividing the mole number of the group V element by the mole number of the group III, the group V element being included in the material gas that is supplied when the group III nitride semiconductor layer is grown by the vapor phase growth, and represents the supply ratio of the group V element and the group III element. The steps of forming the cavity-containing layer 20 are described in detail hereinbelow.

First, a growth substrate 10 is prepared. In the present embodiment, a c-plane sapphire substrate on which a GaN-based semiconductor epitaxial layer can be formed by metalorganic chemical vapor deposition (MOCVD) is used as the growth substrate 10.

Figure 5A:
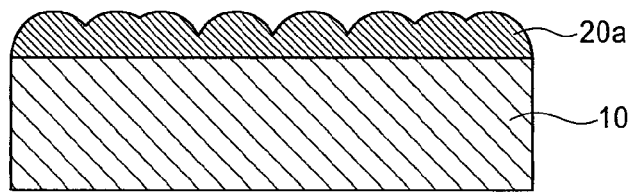
FIGS. 5A to 5I are cross-sectional views of each process step in the steps for manufacturing the semiconductor light-emitting device according to the embodiment of the present invention.

The low-crystallinity base layer $20_a$ composed of a nitride semiconductor is formed on the growth substrate 10. Specifically, the growth substrate 10 is transported into a MOCVD apparatus, the substrate temperature (growth temperature) is set to 525° C., trimethylgallium (TMG) (flow rate: 11 μmol/min) and ammonia ($NH_3$) (flow rate: 3.3 Litter/min) are supplied (in this case, the ratio is about 14,000) in a mixed atmosphere of nitrogen (flow rate: 13.5 Litter/min) and hydrogen (flow rate: 7 Litter/min), and a GaN base layer $20_a$ having low crystallinity is formed to a thickness of about 200 nm (FIG. 5A). The supply of TMG is stopped after the base layer $20_a$ has been formed, and the substrate temperature is increased to 1,000° C.

The base layer $20_a$ has a protrusions/depressions surface, which serves as the base form of the columnar structures 22 and the cavities 21 in the cavity-containing layer 20. The base layer $20_a$ functions as a buffer layer for relaxing lattice mismatch between the growth substrate 10 and the GaN-based semiconductor epitaxial layer 30, and also forms a base for forming the columnar structures 22 and the cavities 21. Accordingly, the base layer $20_a$ is formed on the growth substrate 10 with the base layer $20_a$ having a protrusions/depressions surface in which the height and pitch of the protrusions and depressions are substantially aligned in plane by growing the GaN film at a relatively low temperature and high V/III ratio (3,000 or greater). This is thought to occur because Ga migration is promoted and the GaN film grows evenly on the growth substrate 10 in an ammonia-rich state due to the high V/III ratio. The cavities 21 and the columnar structures 22 can thereby be uniformly formed in the cavity-containing layer 20, and it is possible to form micron-sized columnar structures 22 that constitute the connection portions between the growth substrate 10 and the semiconductor epitaxial layer 30.

The base layer $20_a$ forms a discrete island-shaped structure when growth is carried out when the V/III ratio is relatively low (i.e., less than 3,000). This is due to the fact that when the V/III ratio is low, migration is not promoted, the GaN film is affected by the flow of material gas, thereby producing a dramatic difference in areas in which growth is promoted and areas in which growth is inhibited. In this case, the in-plane distribution of the cavities 21 and the columnar structures 22 becomes non-uniform, the growth substrate 10 is naturally separated, or it becomes difficult to achieve adequate separation of the growth substrate 10 from the cavity-containing layer 20.

The growth temperature can be modified within a range of 425 to 625° C. The TMG flow rate can be modified in a range of 8 to 23 μmol/min, or more preferably 9 to 15 μmol/min, and the $NH_3$ flow rate can be modified in a range of 0.5 to 5.5 Litter/min. In this case, the V/III ratio must be kept in a range of 3,000 to 25,000, or more preferably 9,000 to 25,000. The layers are preferably grown under conditions in which the value of S1/S2 is 0.5 to 10, or more preferably 1 to 5, where S1 is the V/III ratio in the base layer formation step and S2 is the V/III ratio in a later-described semiconductor epitaxial layer formation step. The growth rate of the base layer can be modified in a range of 3 to 45 nm/min, or more preferably 10 to 23 nm/min.

Next, a cavity-containing layer 20 having a thickness of about 400 nm is completed by carrying out in alternating fashion four cycles of a process (referred to as the first step) of growing film under conditions that mainly promote longitudinal growth and a process (referred to as the second step) of growing film under conditions that mainly promote lateral growth, in a mixed atmosphere of nitrogen (6 Litter/min) and hydrogen (13 Litter/min) while keeping the substrate temperature at 1,000° C.

Figure 5B:
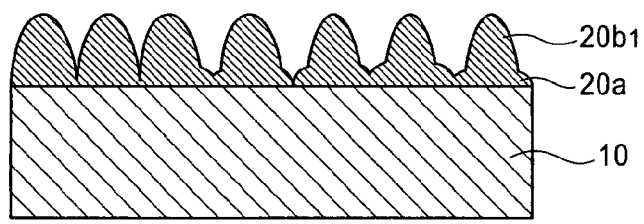

In the first step, the TMG is supplied at a flow rate of 23 μmol/min and $NH_3$ is supplied at a flow rate of 2.2 Litter/min to form a first GaN layer $20_{b1}$ having a thickness of about 20 nm on the base layer $20_a$. In the first step, the GaN film is mainly grown longitudinally on the areas in which dissociation and desorption of the constituent elements of the GaN film is less likely to occur. As a result, the protrusions and depressions formed on the surface of the base layer $20_a$ become more pronounced (FIG. 5B).

Figure 5C:
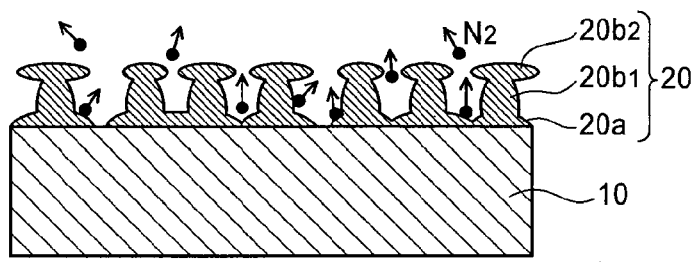

In the second step, TMG is supplied at a flow rate of 45 μmol/min, $NH_3$ is supplied at a flow rate of 4.4 Litter/min, and a second GaN layer $20_{b2}$ having a thickness of about 80 nm is formed. The GaN film grows laterally in the second step from the top part of the first GaN layer $20_{b1}$ that was mainly grown in the longitudinal direction in the first step (FIG. 5C). The first and second steps are repeated four times each in alternating fashion, whereby mutually adjacent nuclei unite together across the depression portions of the GaN film serving as the base form of the cavities 21, and a cavity-containing layer 20 that includes the cavities 21 and the columnar structures 22 is formed. The defect density of the semiconductor epitaxial layer 30 is reduced because lateral growth is carried out a plurality of cycles, whereby the surface of the cavity-containing layer 20 is flattened and crystal defects generated in the boundary between the growth substrate and the GaN film are deflected and do not propagate to the upper portions. It is considered that the difference in the growth direction is due to the difference of the balance between adsorption and dissociation/desorption of the Ga atoms and the N atoms constituting the GaN film, since the flow rates of the TMG and the $NH_3$ are different in the first step and the second step and the growth rates of the GaN are different from each other. Specifically, the growth rate of the GaN film in the first step is 23 nm/min, and the growth rate of the GaN film in the second step is 45 nm/min.

Figure 6:
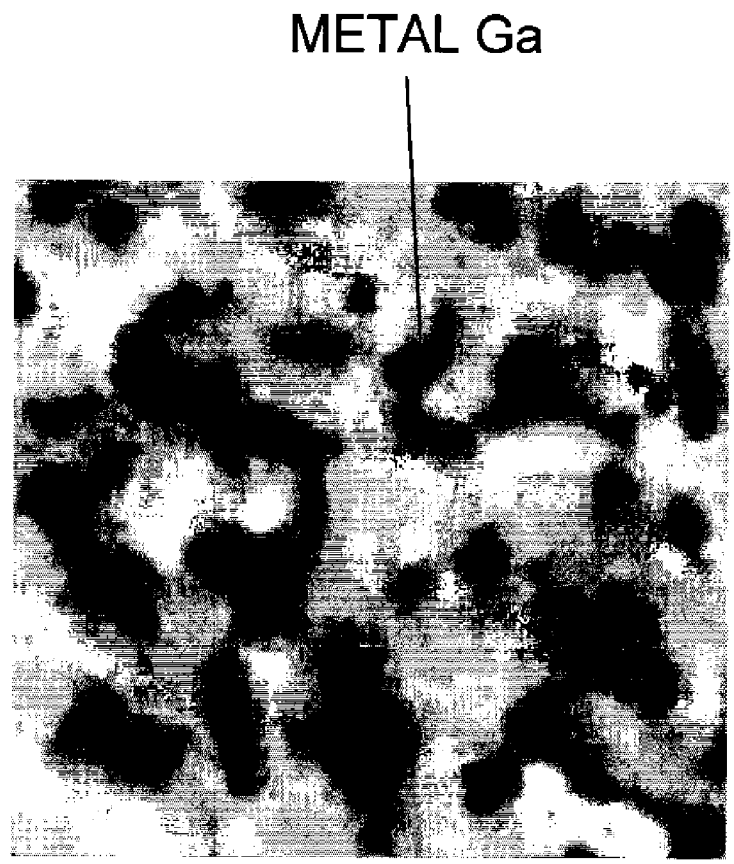
FIG. 6 is a fluorescence photomicrograph of the surface of the semiconductor epitaxial layer exposed by separating the growth substrate.

Reactions such as those below occur in the process for repeatedly carrying out the first step and the second step. The GaN film constituting the cavity-containing layer 20 is grown while repeatedly adsorbing and dissociating/desorbing the supplied Ga atoms and N atoms on the surface. The base form of the cavities 21 is formed as lateral growth proceeds in the second step. At this time, the width of the openings of the upper part of the cavities 21 is gradually reduced and it becomes difficult for $NH_3$ and TMG to enter into the cavities 21. It then becomes difficult for the GaN film to grow in the cavities 21. On the other hand, dissociation/desorption progress in areas with weak crystallinity in the cavities 21 and gaseous nitrogen escapes from the interior of the cavities 21. The size of the cavities 21 is thereby gradually increased, and in concert therewith the size (width) of the columnar structures 22 is reduced. A metal Ga 23 generated by nitrogen desorption cannot escape from the opening portions of the cavities 21 and is therefore left deposited on the growth substrate 10 and the inner walls of the cavities 21. FIG. 6 is a fluorescence photomicrograph of the surface of the semiconductor epitaxial layer 30 exposed after removal of the growth substrate. It can be seen in the photograph that the metal Ga (the dark portion of the photograph) generated by nitrogen desorption is deposited on the GaN film.

Thus, the base layer $20_a$ having low crystallinity is formed with a high V/III ratio on the growth substrate 10, after which the process of repeating longitudinal growth and lateral growth in alternating fashion is carried out, thereby forming a layered structure composed of a growth substrate 10 and a cavity-containing layer 20 in which a plurality of cavities 21 and the columnar structures 22 having a width of 10 μm or less are uniformly distributed. The layered structure can be used as a growth substrate with a separation function or capability in which the growth substrate 10 is endowed with a separation function.

The growth temperature of the GaN film in the first and second steps can be modified in a range of 800 to 1,200° C. In the first step, the TMG flow rate can be modified in a range of 10 to 30 μmol/min, and the NH$_3$ flow rate can be modified in a range of 1 to 3 Litter/min. In the second step, the TMG flow rate can be modified in a range of 30 to 70 μmol/min, and the NH$_3$ flow rate can be modified in a range of 3 to 7 Litter/min. Si may be added as a dopant to a maximum of $5\times10^{17}$ (hereinbelow notated as 5E17) atoms/cm$^3$ when the cavity-containing layer 20b is formed. The thickness of the cavity-containing layer 20 may be modified in a range of 200 to 1,000 nm. In this case, the first GaN layer $20_{b1}$ may be modified in a range of 10 to 60 nm and the second GaN layer $20_{b2}$ may be modified in a range of 30 to 140 nm, in accordance with the size or the like of the cavities to be formed.

[Step S2: Semiconductor Epitaxial Layer Formation Step]

Figure 5D:
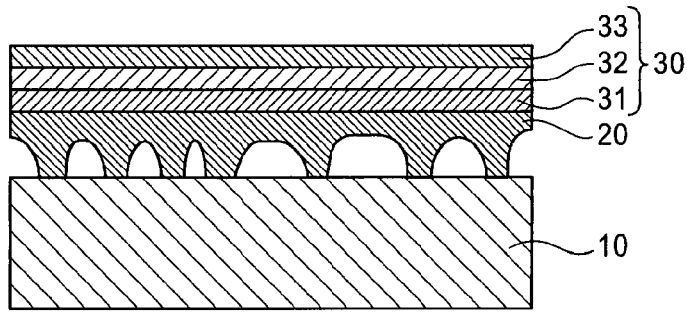

Next, a semiconductor epitaxial layer 30 including an n-layer 31, a light-emission layer 32, and a p-layer 33 each composed of a GaN-based semiconductor are formed on the cavity-containing layer 20 using MOCVD (FIG. 5D).

Specifically, the substrate temperature is set to 1,000° C., TMG (flow rate: 45 μmol/min), NH$_3$ (flow rate: 4.4 Litter/min), and SiH$_4$ as dopant gas are supplied, and an n-layer 31 having a thickness of 3 to 10 μm doped with 5E18 atoms/cm$^3$ of Si is formed. The flow rate of TMG can be modified in a range of 10 to 70 μmol/min. The flow rate of NH$_3$ can be modified in a range of 3.3 to 5.5 Litter/min. The ratio can be set in a range of 2,000 to 22,500, or more preferably 3,000 to 8,000. The growth rate can be set in a range of 0.5 to 5 μm/h.

Next, the substrate temperature is set to 760° C., TMG (flow rate: 3.6 μmol/min), trimethylindium (TMI; flow rate: 3.6 μmol/min), and NH$_3$ (flow rate: 4.4 Litter/min) are supplied and 30 pairs of GaN/In$_y$GaN (both 2 nm) are formed, whereby a strain-relaxing layer (not shown) is formed. The flow rate of TMG and TMI can be modified in a range of 1 to 10 μmol/min. In this case, the flow rates of the TMI and TMG must be simultaneously modified so that the In structure is about 20%. The flow rate of NH$_3$ can be modified in a range of 3.3 to 5.5 Litter/min. In$_x$GaN may be formed in place of GaN. In this case, the flow rate must be adjusted so as to satisfy x<y. The thickness of the strain-relaxing layer can be modified in a range of 50 to 300 nm by modifying the number of pairs and the thickness of each layer of GaN/In$_y$GaN. The strain-relaxing layer may be doped with Si to a maximum of 5E17 atoms/cm$^3$.

Next, the substrate temperature is set to 730° C., TMG (flow rate: 3.6 μmol/min), TMI (flow rate: 10 μmol/min), and NH$_3$ (flow rate: 4.4 Litter/min) are supplied and five pairs of a GaN barrier layer/In$_y$GaN well layer (14 nm/2 nm) are formed, whereby a light-emission layer 32 having a multi-quantum well structure is formed. The flow rate of TMG and TMI can be modified in a range of 1 to 10 μmol/min. In this case, the flow rates of the TMI and TMG must be simultaneously modified so that the value of y indicating the In composition ratio is 35%. The flow rate of NH$_3$ can be modified in a range of 3.3 to 5.5 Litter/min. The light-emission layer 32 may be doped with Si to a maximum of 5E17 atoms/cm$^3$.

Next, the substrate temperature is set to 870° C., TMG (flow rate: 8.1 μmol/min), trimethylaluminum (TMA; flow rate: 7.6 μmol/min), NH$_3$ (flow rate: 4.4 Litter/min), and CP2Mg (bis-cyclopentadienyl Mg) as a dopant gas are supplied, whereby a p-AlGaN layer (not shown) having thickness of about 40 nm and doped with Mg to 1E20 atoms/cm$^3$ is formed. The flow rate of TMG can be modified in a range of 4 to 20 μmol/min. In this case, the flow rates of the TMG and TMA must be simultaneously modified so that the Al structure is about 20%. The flow rate of NH$_3$ can be modified in a range of 3.3 to 5.5 Litter/min. The thickness of the p-AlGaN layer can be modified in a range of 20 to 60 nm.

Next, the substrate temperature is set to 870° C., TMG (flow rate: 18 μmol/min), NH$_3$ (flow rate: 4.4 Litter/min), and CP2Mg (bis-cyclopentadienyl Mg) as a dopant gas are supplied, whereby a p-layer 33 having thickness of about 200 nm and doped with Mg to 1E20 atoms/cm$^3$ is formed. The flow rate of TMG can be modified in a range of 8 to 36 μmol/min. The flow rate of NH$_3$ can be modified in a range of 3.3 to 5.5 Litter/min. The thickness of the p-layer 33 can be modified in a range of 100 to 300 nm.

The p-layer 33 is subsequently activated by heat treatment for about 1 minute in a nitrogen atmosphere of about 900° C.

[Step S3: Support Substrate Bonding Step]

Figure 5E:
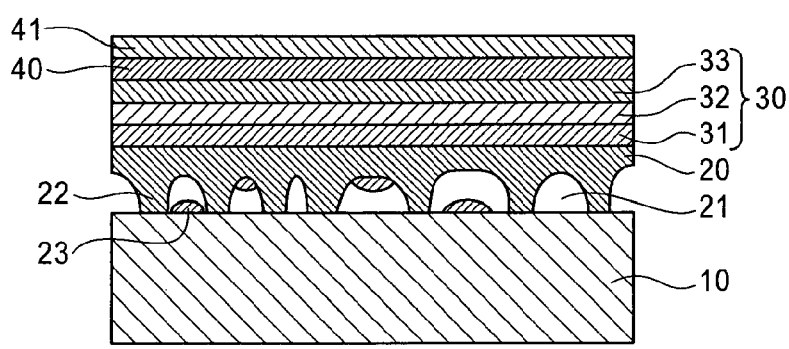
Figure 5F:
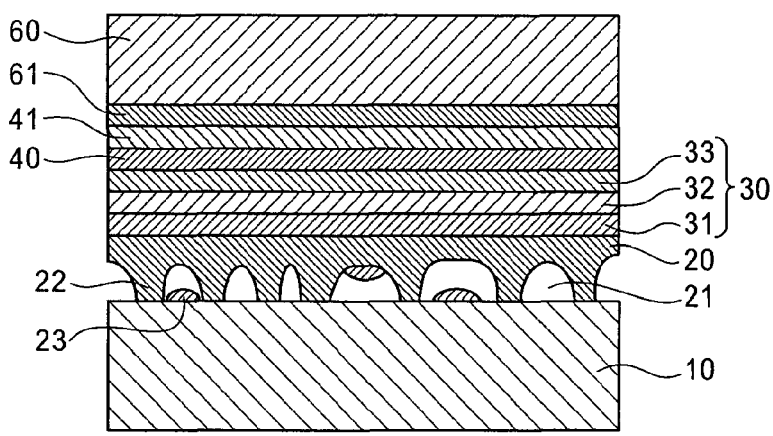

Next, Pt (10 angstroms) and Ag (300 angstroms) are sequentially deposited on the p-layer 33 to form an electrode layer 40. The Pt layer ensures ohmic contact between the p-layer 33 and the electrode layer 40, and the Ag layer assures high reflectivity. Next, Ti (1,000 Å), Pt (2,000 Å), and Au (2,000 Å) are sequentially deposited to form a bonding layer 41. The bonding layer 41 constitutes a bonding portion to a later-described support substrate 60 (FIG. 5E).

Next, a support substrate 60 for supporting, instead of the growth substrate 10, the semiconductor epitaxial layer 30 is prepared. For example, a Si single-crystal substrate can be used as the support substrate 60. A bonding layer 61 is formed by sequentially depositing Pt, Ti, Ni, Au, and AuSn or the like on the support substrate 60. Next, the bonding layer 61 and the bonding layer 41 formed on the semiconductor epitaxial layer 30 are brought into close contact, and the support substrate 60 is affixed (FIG. 5F) to the p-layer 33 side of the semiconductor epitaxial layer 30 by thermocompression bonding in a vacuum or an N$_2$ atmosphere. The support substrate 60 may be formed by plating and growing Cu or another metal film on the semiconductor epitaxial layer 41.

[Step S4: Growth Substrate Removal Step]

Figure 5G:
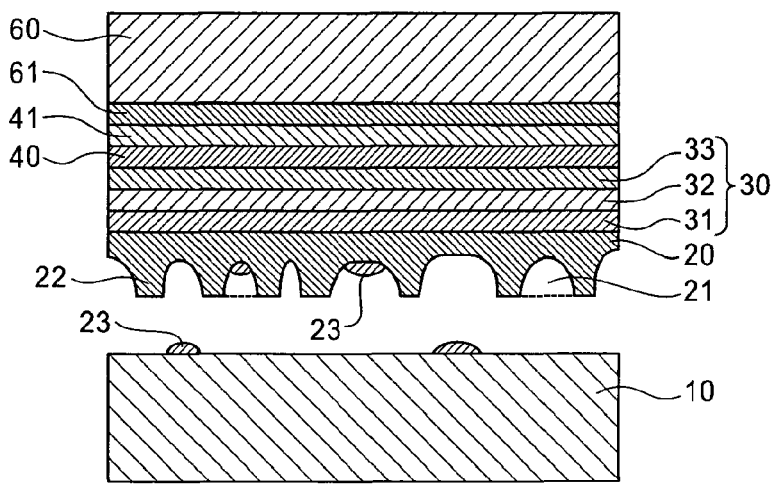

Next, the growth substrate 10 is separated or removed from the semiconductor epitaxial layer 30. The growth substrate 10 is bonded to the semiconductor epitaxial layer 30 via the columnar structures 22 that are uniformly distributed in the cavity-containing layer 20 and have a width of about several microns. Therefore, the growth substrate 10 can be readily separated from the cavity-containing layer 20 by applying a slight force to the connection part from the exterior. Therefore, the growth substrate 10 can be separated without the use of LLO. For example, the growth substrate 10 can be separated by imparting a light impact to the growth substrate 10. The growth substrate 10 can also be separated by imparting vibrations to the wafer using ultrasonic waves or the like. Also, the growth substrate 10 can be separated by allowing a fluid to penetrate the cavities 21 in the cavity-containing layer 20 and heating the fluid to thereby generate water vapor pressure. The growth substrate 10 can also be separated by immersing the wafer in acid or an alkaline solution, and allowing etchant to penetrate the interior of the cavities 21 to thereby etch away the columnar structures 22. It is also possible to separate the growth substrate 10 using LLO in a supplementary fashion. In this case, it is possible to apply a laser irradiation with lower energy density that conventionally used, and to reduce damage to the device (FIG. 5G). When the support substrate bonding step (step S3) has concluded, it is essentially not a problem if the growth substrate 10 is naturally separated due to stress or the like from the support substrate 60. Therefore, the present step can be omitted after the support substrate-bonding step has been carried out by adjusting the mechanical strength of the cavity-containing layer 20 so that separation or removal naturally occurs due to stress from the support substrate 60.

[Step S5: Surface Treatment Step]

Figure 5H:
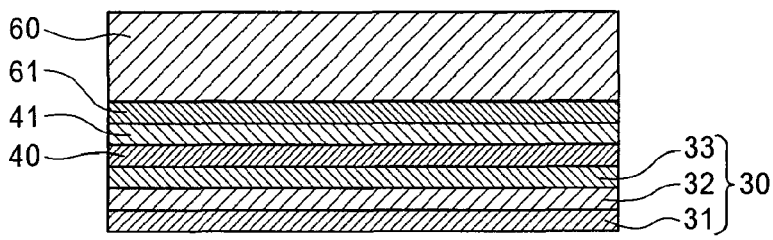
Figure 5I:
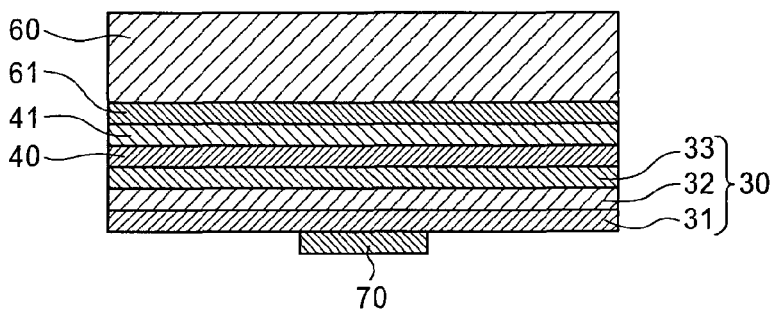

Next, the cavity-containing layer 20 and the metal Ga 23 deposited on the cavity-containing layer 20 are removed to expose the surface of the n-layer 31 by using hydrochloric acid to treat the surface exposed after separation of the growth substrate 10 (FIG. 5H). In the case that the wafer is immersed in acid or alkaline solution to allow etchant to penetrate the interior of the cavities 21 in the growth substrate separation step, the metal Ga 23 can be removed at that time, but when metal Ga is not entirely removed, the metal Ga can be again removed at this stage. The etchant is not limited to hydrochloric acid and may be any etchant that can etch away the GaN film. Examples of the etchant that can be used include phosphoric acid, sulfuric acid, KOH, and NaOH. When KOH or the like is used as the etchant, numerous hexagonal cone-shaped projections (so-called micro-cones) derived from the GaN crystalline structure are formed on the n-layer 31 and this contributes to an improvement of the light extraction efficiency. Also, the surface treatment is not limited to wet etching and may be carried out by dry etching using Ar plasma or a chloride-based plasma.

[Step S6: Electrode Formation Step]

Next, Ti and Al are sequentially deposited by vacuum deposition method or the like on the surface of the surface-treated n-layer 31, and an n-electrode 70 is formed (FIG. 5I) by further depositing Ti/Au on the topmost surface in order to improve bonding characteristics. Other than Ti/Al, it is also possible to use Al/Rh, Al/Ir, Al/Pt, Al/Pd, or the like as the electrode material.

[Step S7: Chip Separation Step]

Next, the semiconductor epitaxial layer 30 having a support substrate and on which the n-electrode 70 has been formed is separated into individual chips or dies. This step is carried out by first using a resist to form a pattern that is designed to provide grooves between each chip on the surface of the semiconductor epitaxial layer 30. A groove is subsequently formed from the surface of the semiconductor epitaxial layer 30 to a depth that reaches the electrode layer 40 using reactive ion etching. The support substrate 60 is thereafter separated into chips by dicing. A laser scribing or another technique may also be used. The semiconductor light-emitting device is completed via the steps described above.

Figure 7A:
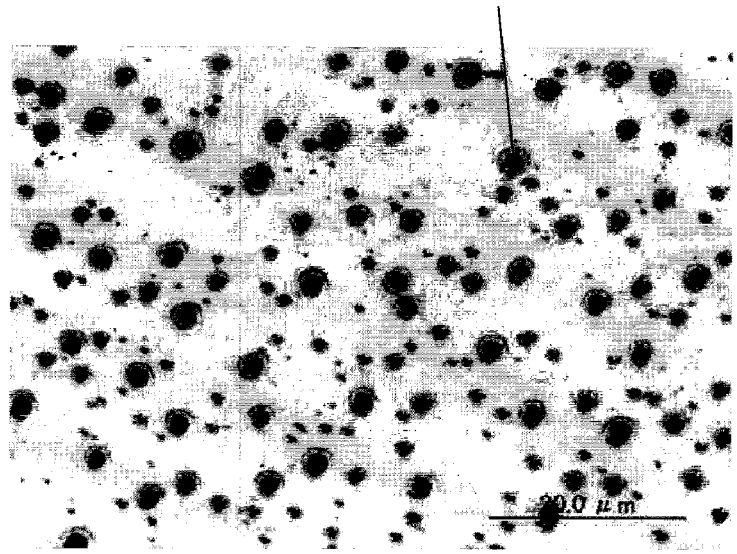
FIG. 7A is an SEM image of the separation surface of the sapphire substrate separated in the growth substrate separation step.
Figure 7B:
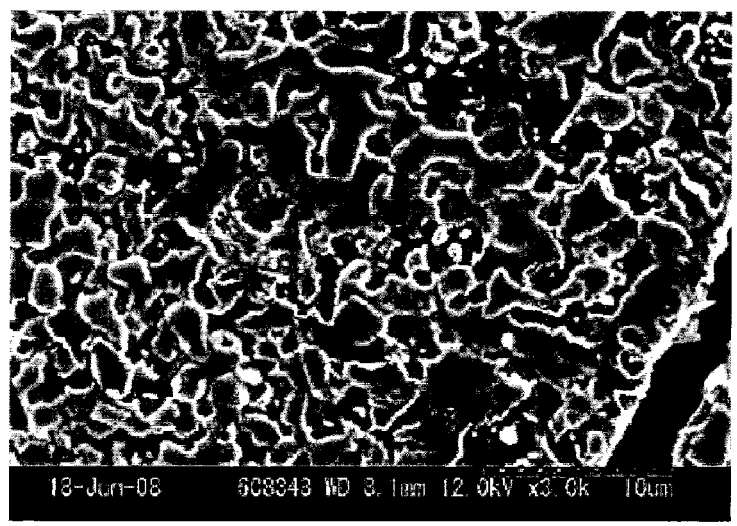
FIG. 7B is an SEM image of the separation surface of the semiconductor epitaxial layer.

As described above, according to the method for manufacturing a semiconductor light-emitting diode of the present embodiment, numerous cavities 21 and micro-level (18 μm or less) columnar structures 22 in the cavity-containing layer 20 are formed so as to be uniformly distributed. The columnar structures 22 constitute the connection portions between the growth substrate 10 and the semiconductor epitaxial layer 30. FIG. 7A is an SEM image of the separation or removal surface of the sapphire substrate removed in the growth substrate separation step, and FIG. 7B is an SEM image of the separation surface of the semiconductor epitaxial layer 30. The vestiges of the columnar structures 22 can be confirmed in the separation surface of the sapphire substrate. It can also be confirmed from the SEM image that numerous cavities and columnar structures having micro-order widths are uniformly distributed in the plane.

A cavity-containing layer 20 having such a structure is disposed between the growth substrate 10 and the semiconductor epitaxial layer 30, whereby sufficient bonding strength can be obtained such that natural separation or removal of the growth substrate 10 does not occur between the growth substrate 10 and the semiconductor epitaxial layer. On the other hand, the growth substrate 10 can be readily separated by applying an external force or the like without the use of LLO in the growth substrate separation step. Therefore, introduction of an expensive LLO apparatus is not required, and the time required for separating the growth substrate can be considerably reduced. Since lateral growth of GaN is performed in the process for forming the cavity-containing layer, it is possible to prevent propagation of crystal defects to the semiconductor epitaxial layer including the light-emitting layer, and a high-quality semiconductor epitaxial layer can be formed.

The invention has been described with reference to the preferred embodiments thereof. It should be understood by those skilled in the art that a variety of alterations and modifications may be made from the embodiments described above. It is therefore contemplated that the appended claims encompass all such alternations and modifications.

This application is based on Japanese Patent Application No. 2008-327478 which is hereby incorporated by reference.

What is claimed is:

1. A method for manufacturing a semiconductor device, the method comprising:
    forming on a growth substrate a cavity-containing layer composed of a group III nitride compound semiconductor, and including cavities and columnar structures interspersed therein;
    forming a group III nitride compound semiconductor epitaxial layer on said cavity-containing layer;
    bonding a support substrate on said group III nitride compound semiconductor epitaxial layer; and
    separating the growth substrate from said group III nitride compound semiconductor epitaxial layer from said cavity-containing layer, the interface therebetween serving as a separation boundary.

2. The method of claim 1, wherein forming said cavity-containing layer comprises:
    forming on said growth substrate a base layer composed of a group III nitride and having columnar structures; and
    repeating in alternating fashion a plurality of cycles of a first growth step and a second growth step of growing a group III nitride at growth rates different from each other on said base layer.

3. The method of claim 2, wherein:
    the first growth step includes a process for supplying a group V material and a group III material at their respective predetermined flow rates at a higher growth temperature than the growth temperature of said base layer, and growing said group III nitride mainly in the longitudinal direction; and
    the second growth step includes a process for supplying a group V material and a group III material at flow rates that are greater than the flow rates in said first growth step at a higher growth temperature than the growth temperature of said base layer, and growing said group III nitride mainly in the lateral direction.

4. The method of claim 2, wherein a value of S1/S2 is 0.5 or higher, where S1 is a supply ratio of a group V material and a group III material (V/III ratio) in forming said base layer, and S2 is a supply ratio of a group V material and a group III material (V/III ratio) in forming said group III nitride compound semiconductor epitaxial layer.

5. The method of claim 2, wherein forming said base layer is carried out under conditions in which the group V material and the group III material are supplied so that the V/III ratio is 3,000 or higher at a lower temperature than the growth temperature of said group III nitride compound semiconductor epitaxial layer.

6. The method of claim 1, wherein a value of $T_1 \times T_2$ is in a range of 0.6 to 2.5, where $T_1$ is a thickness in microns of said cavity-containing layer, and $T_2$ is a thickness in microns of said group III nitride compound semiconductor epitaxial layer.

7. The method of claim 1, wherein in separating said growth substrate, said growth substrate is naturally separated.

8. The method of claim 1, wherein separating said growth substrate includes a process for imparting an external force to said cavity-containing layer.

9. The method of claim 1, wherein separating said growth substrate includes a process for applying heat after causing a fluid to penetrate an interior of the cavity-containing layer.

10. The method of claim 7, further comprising removing metal Ga deposited on a surface exposed by separating said growth substrate after the separating said growth substrate.

11. The method of claim 1, wherein separating the growth substrate includes a process of applying wet etching to said cavity-containing layer.

12. The method of claim 11, wherein metal Ga deposited on a surface exposed by separating said growth substrate is simultaneously removed in the process of applying wet etching to said cavity-containing layer.

13. The method of claim 1, wherein forming said group III nitride compound semiconductor epitaxial layer includes forming an n-type group III nitride compound semiconductor layer, a light-emitting layer, and a p-type group III nitride compound semiconductor layer.

14. A method for manufacturing a layered structure, the method comprising:
   forming on a growth substrate a cavity-containing layer composed of a group III nitride compound semiconductor and having cavities and columnar structures interspersed therein;
   wherein forming said cavity-containing layer comprises:
      supplying a group V material and a group III material so that the V/III ratio is 3000 or higher, and forming on said growth substrate a base layer composed of a group III nitride having columnar structures on a surface thereof; and
      repeating in alternating fashion a plurality of cycles of a first growth step and a second growth step of growing a group III nitride at growth rates different from each other on said base layer.

15. The method of claim 14, wherein:
   the first growth step includes a process for supplying a group V material and a group III material at their respective predetermined flow rates at a higher growth temperature than the growth temperature of said base layer, and growing said group III nitride mainly in the longitudinal direction; and
   the second growth step includes a process for supplying a group V material and a group III material at flow rates that are greater than the flow rates in said first growth step at a higher growth temperature than the growth temperature of said base layer, and growing said group III nitride mainly in the lateral direction.

16. A semiconductor wafer comprising:
   a growth substrate;
   a cavity-containing layer composed of a group III nitride compound semiconductor formed on said growth substrate, and including cavities and columnar structures interspersed in said cavity-containing layer; and
   a group III nitride compound semiconductor epitaxial layer formed on said cavity-containing layer,
   wherein said cavity-containing layer includes metal Ga deposited on inner walls of said cavities.

17. The semiconductor wafer of claim 16, wherein a width of said columnar structures is between 1 μm and 18 μm, inclusive.

18. A semiconductor wafer comprising:
   a growth substrate;
   a cavity-containing layer composed of a group III nitride compound semiconductor formed on said growth substrate, and including cavities and columnar structures interspersed in said cavity-containing layer; and
   a group III nitride compound semiconductor epitaxial layer formed on said cavity-containing layer,
   wherein a value of $T_1 \times T_2$ is 0.6 to 2.5, where $T_1$ is a thickness in microns of said cavity-containing layer, and $T_2$ is a thickness in microns of said group III nitride compound semiconductor epitaxial layer.

19. The semiconductor wafer of claim 16, wherein said group III nitride compound semiconductor epitaxial layer comprises an n-type group III nitride compound semiconductor layer, a light-emitting layer, and a p-type group III nitride compound semiconductor layer.

20. A layered structure comprising:
   a growth substrate; and
   a cavity-containing layer composed of a group III nitride compound semiconductor and including cavities and columnar structures interspersed in the cavity-containing layer, the cavity-containing layer being disposed on the growth substrate,
   wherein said cavity-containing layer includes metal Ga deposited on inner walls of said cavities.

21. The layered structure of claim 20, wherein a width of said columnar structures is between 1 μm and 18 μm, inclusive.

22. A layered structure comprising a growth substrate and a group III nitride layer that is layered on the growth substrate, wherein said group III nitride layer comprises a layer having a plurality of internal cavities formed by supplying a group V material and a group III material so that the V/III ratio is 3000 or higher, forming on said growth substrate a base layer having a group III nitride, and subsequently carrying out in alternating fashion a plurality of cycles of a first growth step and a second growth step of growing a group III nitride at growth rates different from each other on said base layer.

23. The layered structure of claim 22, wherein the layer having said cavities has columnar structures with a width of 1 μm or more and 18 μm or less interspersed in the layer.

24. The semiconductor wafer of claim 18, wherein said cavity-containing layer includes metal Ga deposited on inner walls of said cavities.

25. The semiconductor wafer of claim 18, wherein a width of said columnar structures is between 1 μm and 18 μm, inclusive.

26. The semiconductor wafer of claim 18, wherein said group III nitride compound semiconductor epitaxial layer comprises an n-type group III nitride compound semiconductor layer, a light-emitting layer, and a p-type group III nitride compound semiconductor layer.

* * * * *